(12) United States Patent
Wu et al.

(10) Patent No.: US 7,724,506 B2
(45) Date of Patent: May 25, 2010

(54) ELECTRONIC DEVICE

(75) Inventors: Chia-Kang Wu, Taipei Hsien (TW); Lung-Sheng Tsai, Taipei Hsien (TW); Li-Ping Chen, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/327,642

(22) Filed: Dec. 3, 2008

(65) Prior Publication Data

US 2010/0053855 A1    Mar. 4, 2010

(30) Foreign Application Priority Data

Sep. 2, 2008    (CN) .................... 2008 2 0302004

(51) Int. Cl.
*G06F 1/16*    (2006.01)
(52) U.S. Cl. ................... 361/679.01; 248/74.2; 361/801
(58) Field of Classification Search ............ 361/679.01, 361/801, 759, 747, 826; 24/297; 439/445, 439/470, 460; 248/74.2; 174/84 C
See application file for complete search history.

(56) References Cited

U.S. PATENT DOCUMENTS

| 3,423,055 | A | * | 1/1969 | Fisher | 248/73 |
| 4,457,482 | A | * | 7/1984 | Kitagawa | 248/74.3 |
| 4,669,688 | A | * | 6/1987 | Itoh et al. | 248/74.2 |
| 6,164,603 | A | * | 12/2000 | Kawai | 248/73 |
| 6,621,714 | B1 | * | 9/2003 | Li et al. | 361/801 |
| 6,724,637 | B2 | * | 4/2004 | Li et al. | 361/760 |
| 6,923,407 | B2 | * | 8/2005 | Takeuchi | 248/73 |
| 2009/0231817 | A1 | * | 9/2009 | Xue | 361/759 |

* cited by examiner

*Primary Examiner*—Lisa Lea-Edmonds
(74) *Attorney, Agent, or Firm*—Clifford O. Chi

(57) ABSTRACT

An electronic device includes a chassis configured to hold electronic elements with cables, and a securing member. The chassis includes a bottom plate and at least one clip protruding from the bottom plate. The securing member includes a base portion fixed on the bottom plate, an end portion, and a neck portion connecting the base portion to the end portion. The base portion is resiliently deformable for maintaining the cables between the base portion and the bottom plate. The neck portion slidably engages with the at least one clip of the bottom plate. The end portion is configured to prevent the neck portion from disengaging from the at least one clip.

12 Claims, 3 Drawing Sheets

ELECTRONIC DEVICE

BACKGROUND

1. Technical Field

The present disclosure relates to an electronic device with cables.

2. Description of the Related Art

A typical personal computer system or server includes a chassis for securing electronic elements, for example, a motherboard, hard disk drives, and so on. The electronic elements are connected to other electronic elements with cables. If the cables are not arranged or maintained in an orderly manner, it becomes very inconvenient to maintain or replace the electronic elements secured in the chassis.

DETAILED DESCRIPTION OF THE EMBODIMENTS

Figure 1:
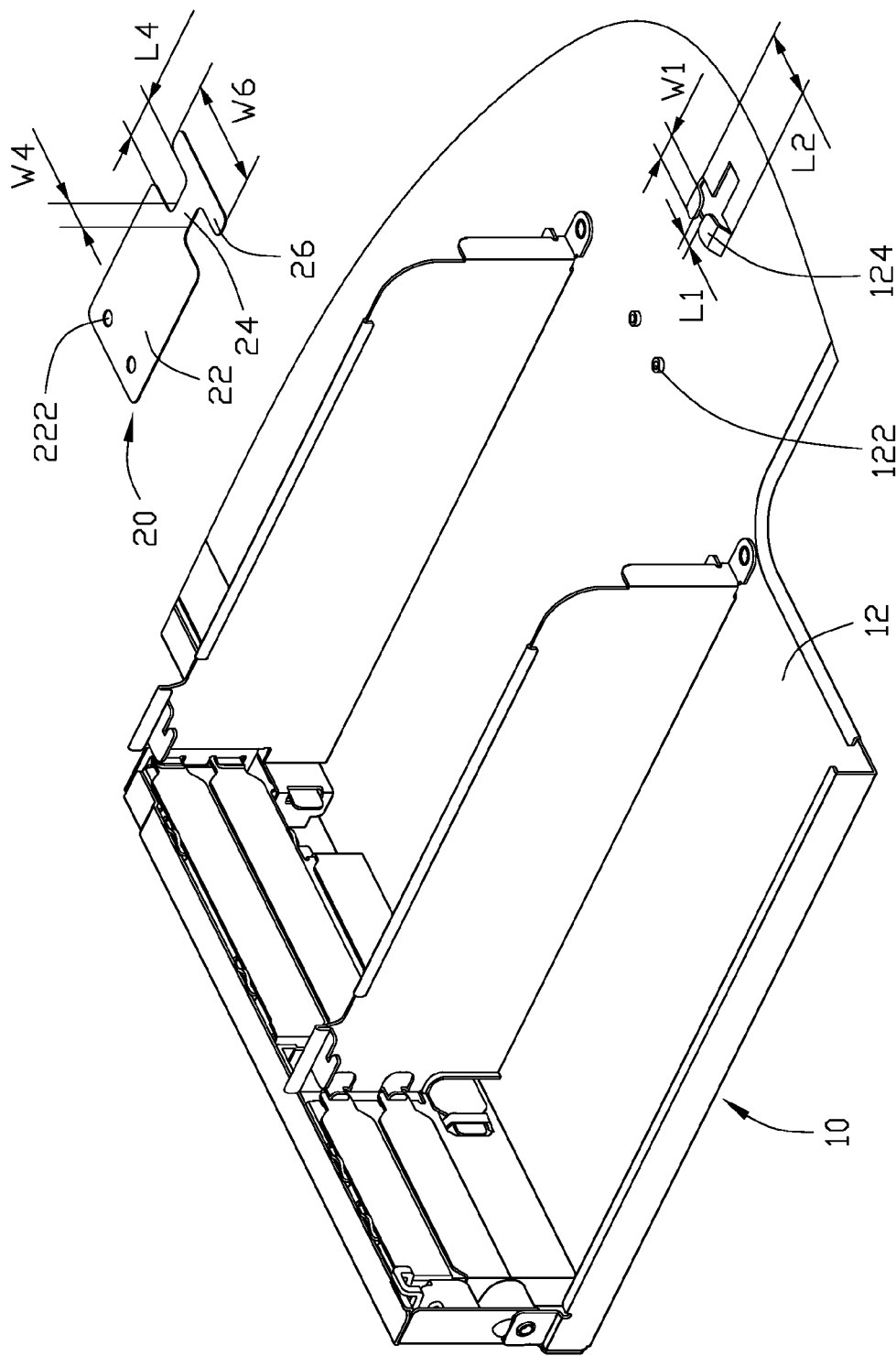
FIG. 1 is an exploded, isometric, partial view of an embodiment of an electronic device, the electronic device including a chassis and a securing member.

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

Referring to FIG. 1, an embodiment of an electronic device includes a chassis 10, and a securing member 20 attached to the chassis 10.

The chassis 10 is configured to hold electronic elements, for example, a motherboard, a hard disk drive, and so on. The chassis 10 includes a bottom plate 12. Two posts 122 protrude from an inner surface of the bottom plate 12. Two clips 124 each with a width W1 protrude from the inner surface of the bottom plate 12, and extend toward each other. Each of the clips 124 has a mounting end connected to the bottom plate 12, and a free end. The two clips 124 have a distance L1 between the free ends thereof, and a distance L2 between the mounting ends. The distance L2 is greater than the distance L1.

The securing member 20 is resiliently deformable. In the illustrated embodiment, the securing member 20 is a resilient sheet-shaped board. The securing member 20 includes a base portion 22, an end portion 26, and a neck portion 24 connecting the base portion 22 to the end portion 26. The base portion 22 defines two holes 222 corresponding to the posts 122 of the chassis 10. The neck portion 24 has a length L4 greater than the width W1 of each clip 124, and a width W4 greater than the distance L1 of the clips 124, but smaller than the distance L2 of the clips 124. The end portion 26 has a width W6 greater than the distance L2 of the clips 124.

Figure 2:
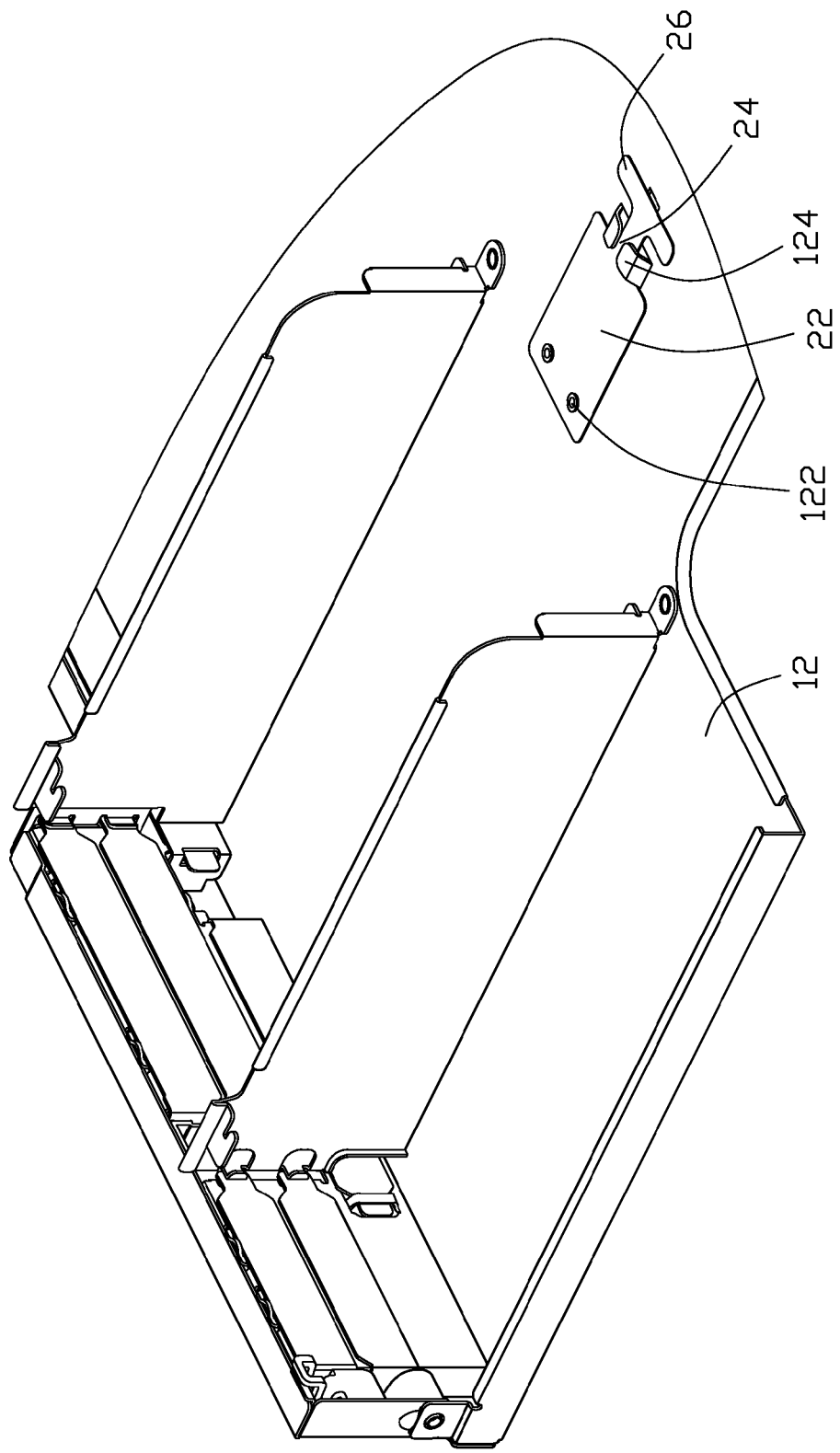
FIG. 2 is an assembled view of FIG. 1.

Referring also to FIG. 2, the posts 122 of the bottom plate 12 of the chassis 10 are inserted into the corresponding holes 222 of the base portion 22 of the securing member 20, and then the base portion 22 of the securing member 20 is fixed on the bottom plate 12 by a fastening means, such as riveting. The neck portion 24 of the securing member 20 is positioned between the clips 124 and the bottom plate 12. Since the distance L1 between the free ends of the clips 124 is smaller the width W4 of the neck portion 24 of the securing member 20, the neck portion 24 is prevented from accidentally disengaging from the clips 124. The base portion 22 of the securing member 20 is adjacent the clips 124, and because the length L4 of the neck portion 24 is greater than the width W1 of each clip 124, a distance is formed between the end portion 26 and each clip 124.

Figure 3:
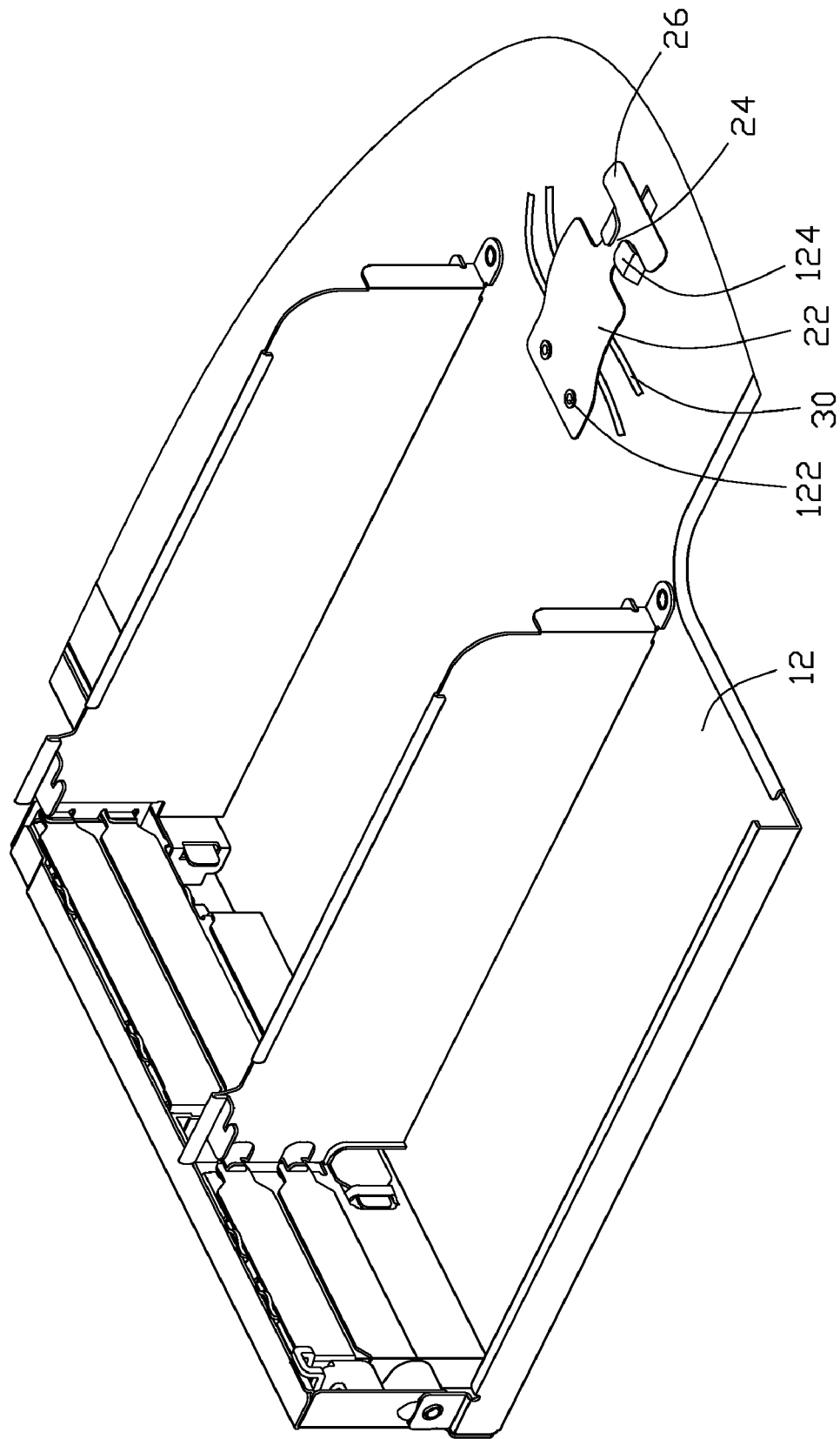
FIG. 3 is similar to FIG. 2, but showing cables secured between the securing member and the chassis.

Referring also to FIG. 3, to maintain cables 30 connected to the electronic elements of the electronic device in an orderly manner, the base portion 22 of the securing member 20 is resiliently deformed up to pull the neck portion 24 and the end portion 26 to slide relative to the clips 124 until the end portion 26 is near to or contacting the clips 124. The cables 30 can then be inserted between the base portion 22 of the securing member 20 and the bottom plate 12. Thus, the cables 30 can be held and maintained in an orderly fashion in the chassis 10.

It is to be understood, however, that even though numerous characteristics and advantages have been set forth in the foregoing description of embodiments, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device, comprising:
   a chassis configured to hold electronic elements with cables, the chassis comprising a bottom plate and at least one clip protruding from the bottom plate; and
   a securing member comprising a base portion fixed on the bottom plate, an end portion, and a neck portion connecting the base portion to the end portion, wherein the base portion is resiliently deformable for maintaining the cables between the base portion and the bottom plate; the neck portion slidably engages with the at least one clip of the bottom plate; the end portion is configured to prevent the neck portion from disengaging from the at least one clip.

2. The electronic device of claim 1, wherein the neck portion of the securing member has a length greater than a width of the at least one clip.

3. The electronic device of claim 2, wherein a distance is formed between the at least one clip and the end portion of the securing member so that the neck portion is slidable when the base portion of the securing member is deformed.

4. The electronic device of claim 1, wherein the end portion of the securing member has a width greater than a width of the neck portion of the securing member.

5. The electronic device of claim 1, wherein at least one post protrudes from the bottom plate of the chassis; the base portion of the securing member defines at least one hole for receiving the at least one post of the bottom plate.

6. An electronic device, comprising:
   a chassis configured for holding electronic elements with cables, the chassis comprising a bottom plate; and
   a securing member comprising a first portion secured on the bottom plate, and a second portion attachable to and slidable on the bottom plate, wherein the securing member is resiliently deformable to maintain the cables between the securing member and the bottom plate.

7. The electronic device of claim 6, wherein the securing member further comprises a third portion configured to prevent the second portion from disengaging from the bottom plate.

8. The electronic device of claim 7, wherein a width of the second portion is smaller than a width of the third portion.

9. The electronic device of claim 7, wherein two clips protrude from the bottom plate and extend toward each other; the clips engage with the second portion of the bottom plate so that the second portion is attachable to and slidable on the bottom plate.

10. The electronic device of claim 9, wherein a width of each of the clips is smaller than a length of the second portion so that the second portion is slidable relative to the clips after the clips engage with second portion.

11. The electronic device of claim 9, wherein each of the clips has a mounting end connected to the bottom plate, and a free end; a width of the second portion is smaller than a distance between the mounting ends of the clips, but greater than a distance between the free ends of the clips.

12. The electronic device of claim 11, wherein a width of the third portion is greater than the distance between the mounting ends of the clips so as to prevent the second portion from disengaging from the clips.

* * * * *